United States Patent
Fan et al.

(10) Patent No.: US 6,706,575 B2
(45) Date of Patent: Mar. 16, 2004

(54) METHOD FOR FABRICATING A NON-VOLATILE MEMORY

(75) Inventors: Tso-Hung Fan, Taipei Hsien (TW); Yen-Hung Yeh, Taoyuan Hsien (TW); Kwang-Yang Chan, Hsinchu (TW); Mu-Yi Liu, Taichung (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 138 days.

(21) Appl. No.: 10/055,265

(22) Filed: Jan. 22, 2002

(65) Prior Publication Data

US 2003/0134462 A1 Jul. 17, 2003

(30) Foreign Application Priority Data

Jan. 16, 2002 (TW) ........................................ 91100555 A

(51) Int. Cl.⁷ ............................................. H01L 21/336
(52) U.S. Cl. ..................................................... 438/197
(58) Field of Search ................. 438/197, 199, 438/253, 259, 300, 592, 164, 151, 183, 257, 291; 257/288

(56) References Cited

U.S. PATENT DOCUMENTS 6,531,350 B2 * 3/2003 Satoh et al. ................ 438/197

* cited by examiner

Primary Examiner—Kamand Cuneo
Assistant Examiner—Monica D. Harrison
(74) Attorney, Agent, or Firm—J. C. Patents

(57) ABSTRACT

A method for fabricating a non-volatile memory is described. A substrate having a strip stacked structure thereon is provided. A buried drain is then formed in the substrate beside the strip stacked structure and an insulating layer is formed on the buried drain. A silicon layer and a cap layer are sequentially formed over the substrate. The cap layer, the silicon layer and the strip stacked structure are then patterned successively in a direction perpendicular to the buried drain, wherein the strip stacked structure is patterned into a plurality of gates. A liner oxide layer is formed on the exposed surfaces of the gates, the substrate and the silicon layer. Thereafter, the cap layer is removed and a metal salicide layer is formed on the exposed surface of the silicon layer.

20 Claims, 6 Drawing Sheets

METHOD FOR FABRICATING A NON-VOLATILE MEMORY

CROSS-REFERENCE TO RELATED APPLICATION

This application claims the priority benefit of Taiwan application serial no. 91100555, filed Jan. 16, 2002.

BACKGROUND OF THE INVENTION

1. Field of Invention

The present invention relates to a method for fabricating a semiconductor device. More particularly, the present invention relates to a method for fabricating a non-volatile memory (NVM).

2. Description of Related Art

The non-volatile memory is widely used in many fields since the data stored in a non-volatile memory is retained when power is being not supplied to the non-volatile memory. The family of the non-volatile memory includes the mask read-only memory (Mask ROM) and the nitride read-only memory (NROM), which two have similar structures.

Refer to FIGS. 1A~1D, FIGS 1A~1D illustrate a process flow of fabricating a non-volatile memory in the prior art in a cross-sectional view.

Refer to FIG. 1A, a substrate 100 is provided. A strip stacked structure 101 comprising a gate oxide layer 102 (or a charge trapping layer 102), a polysilicon layer 104 and a nitride cap layer 105 is formed on the substrate 100. A buried drain 106 is then formed in the substrate 100 beside the strip stacked structure 101.

Refer to FIG. 1B, an insulating layer 108 is formed over the substrate 100 covering the strip stacked structure 101.

Refer to FIG. 1C, the insulating layer 108 is etched back to expose the nitride cap layer 105 and then the nitride cap layer 105 is removed. The insulating layer 108 thus covers only the buried drain 106.

Refer to FIG. 1D, a conductive layer 110 is then formed over the substrate 100 covering the polysilicon layer 104 and the insulating layer 108. The conductive layer 110 and the polysilicon layer 104 are then patterned successively to form a plurality of word-lines perpendicular to the buried drain 106 and a plurality of gates, respectively. The gates arranged in one row electrically connect with one word-line.

In the process described above, the conductive layer 110 usually comprises tungsten silicide ($WSi_x$). However, since the tungsten silicon process requires a temperature higher than 1000° C., the dopants in the buried drain 106 easily diffuse out to shorten the channel between two buried drains 106. Therefore, the scalability of the memory device is restricted in consideration of the short channel effect (SCE). Moreover, the tungsten silicide word-lines have a higher resistance so that the performance of the memory device is hard to improve.

SUMMARY OF THE INVENTION

Accordingly, this invention provides a method for fabricating a nonvolatile memory to facilitate the scaling down of a memory device.

This invention provides a method for fabricating a non-volatile memory to enhance the performance of the memory device.

This invention provides a method for fabricating a NROM. A substrate having a strip stacked structure thereon is provided. The strip stacked structure comprises a conductive layer and a charge trapping layer, wherein the charge trapping layer can be a silicon oxide/silicon nitride/silicon oxide (ONO) stacked layer, a nitride/nitride/nitride (NNN) stacked layer, or a nitride/nitride/oxide (NNO) stacked layer. A buried drain is then formed in the substrate beside the strip stacked structure and an insulating layer is formed on the buried drain. A polysilicon layer and a cap layer are sequentially formed over the substrate. The cap layer, the polysilicon layer and the strip stacked structure are successively patterned in a direction perpendicular to the buried drain, wherein the strip stacked structure is patterned into a plurality of gates. A liner oxide layer is formed on the exposed surfaces of the gates, the substrate, and the polysilicon layer by thermal oxidation. Thereafter, the cap layer is removed, a metal layer is formed over the substrate, and then an annealing process is conducted to cause the metal to react with the polysilicon layer to form a metal salicide (self-aligned silicide) layer. The unreacted metal layer is then removed to leave the metal salicide layer to serve as a word-line that is electrically connected with the gates.

In the method for fabricating a NROM of this invention, the metal layer may comprise titanium (Ti) or cobalt (Co). When a titanium layer is adopted, the annealing process requires a temperature from about 600° C. to about 800° C. When a cobalt layer is adopted, on the other hand, the annealing process requires a temperature from about 600° C. to about 700° C.

This invention also provides a method for fabricating a Mask ROM, which is similar to the above-mentioned method for fabricating a NROM of this invention, except that a gate dielectric layer, instead of the charge trapping layer, is formed on the substrate.

Since the temperature required in the metal salicide process in this invention is lower than that required in the tungsten silicide process in the prior art, the thermal budget is decreased and scaling down the memory device is therefore easier.

Moreover, since the resistance of the metal salicide (titanium/cobalt salicide) word-line in this invention is lower than that of the tungsten silicide word-line in the prior art, the performance of the memory device can be enhanced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
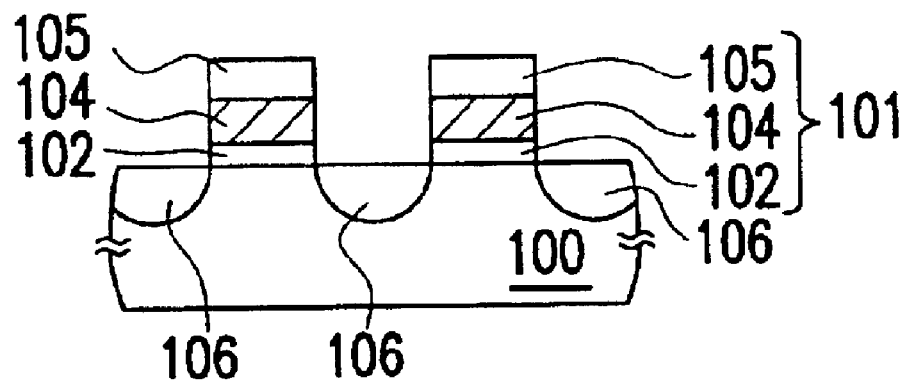
FIGS. 1A~1D illustrate a process flow of fabricating a non-volatile memory in the prior art in a cross-sectional view.
Figure 1B:
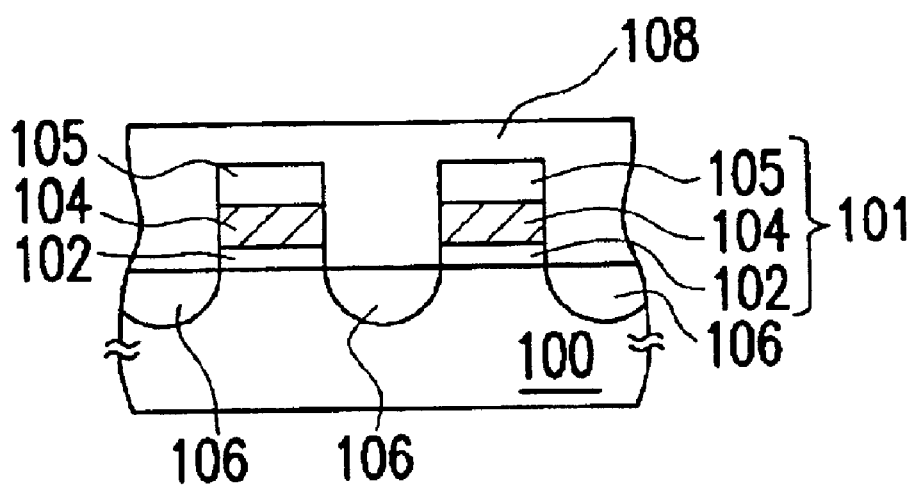
Figure 1C:
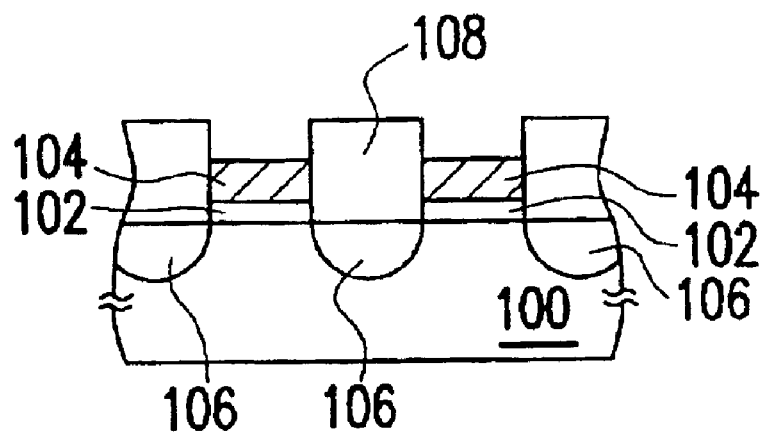
Figure 1D:
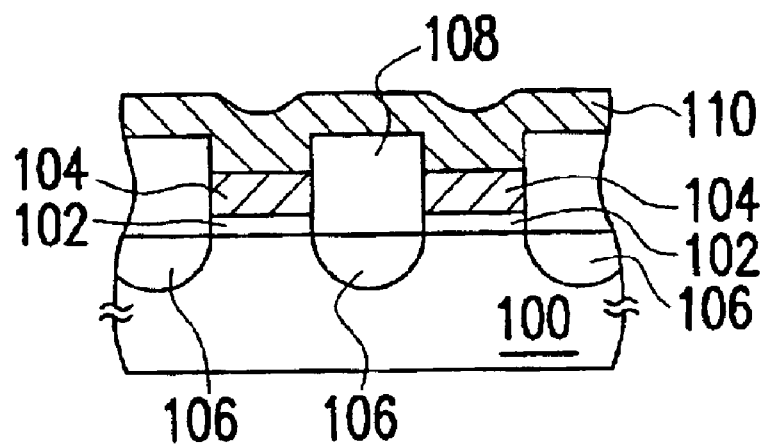
Figure 2A:
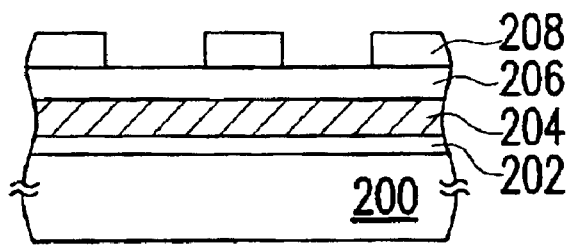
FIGS. 2A~2L illustrate the process flow of fabricating a non-volatile memory according to a preferred embodiment of this invention.

Refer to FIG. 2A, a substrate 200 is provided and then a dielectric layer 202, a gate conductive layer 204, a nitride layer 206, and a patterned photoresist layer 208 are sequentially formed on the substrate 200. The gate conductive layer 204 comprises, for example, polysilicon. The dielectric layer 202 is a gate oxide layer or a charge trapping layer dependent on whether a Mask ROM or a NROM is being fabricated. When the dielectric layer 202 is a charge trapping layer, it comprises, for example, a silicon oxide/silicon nitride/silicon oxide (ONO) stacked layer, a nitride/nitride/nitride (NNN) stacked layer or a nitride/nitride/oxide (NNO) stacked layer.

Figure 2B:
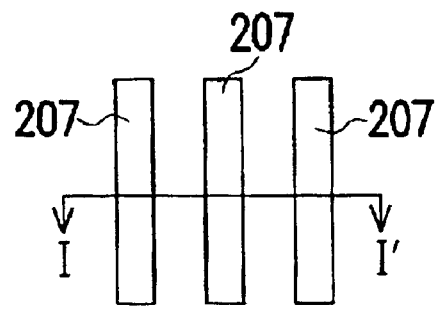
Figure 2C:
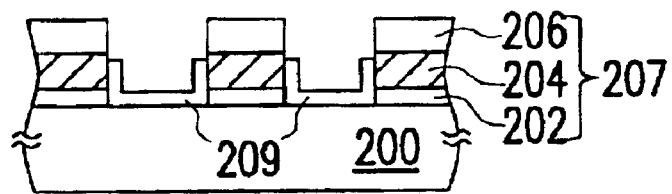

Refer to FIG. 2B and FIG. 2C, wherein FIG. 2B schematically depicts a top view of a resulting structure formed after the subsequent manufacturing steps and FIG. 2C depicts a cross-sectional view of the resulting structure along the line I–I' in FIG. 2B. As that shown in FIGS. 2B~2C, the nitride layer 206, the gate conductive layer 204, and the dielectric layer 202 are patterned with the photoresist layer 208 as a mask to form a plurality of strip stacked structures 207. As that shown in FIG. 2C, a liner layer 209 is formed on the exposed surfaces of the substrate 200 and the gate conductive layer 204. The liner layer 209 comprises, for example, silicon oxide and is formed by a method such as thermal oxidation.

Figure 2D:
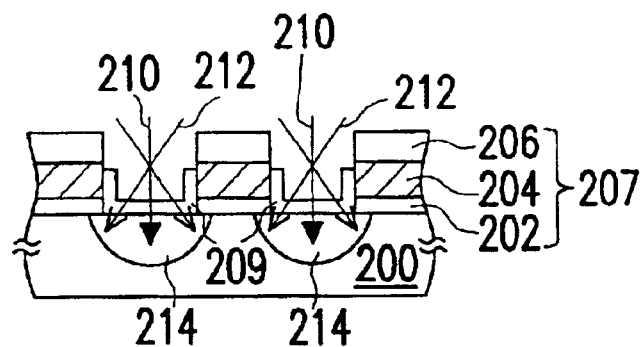

Refer to FIG. 2D, a drain implantation 210 and a pocket implantation 212 are conducted to form a buried drain 214 and a pocket doped region (not shown), respectively, in the substrate 200 beside the strip stacked structure 207. The buried drain 214 is of N-type, for example.

Since the liner layer 209 is formed on the exposed surfaces of the substrate 200 and the gate conductive layer 204, damages will not be easily on the substrate 200 and the gate conductive layer 204 during the drain implantation 210 and the pocket implantation 212.

Figure 2E:
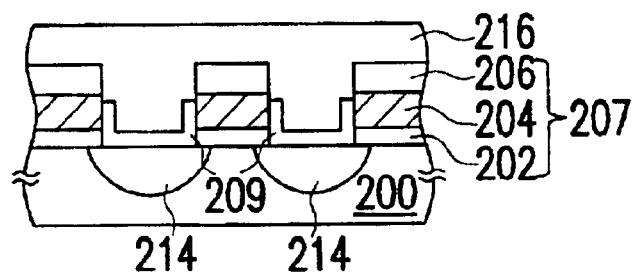

Refer to FIG. 2E, an insulating layer 216 is formed over the substrate 200 covering the strip stacked structure 207 and the liner layer 209. The insulating layer 216 is formed by, for example, chemical vapor deposition (CVD) and comprises, for example, silicon oxide formed with tetraethyl-ortho-silicate (TEOS-oxide).

Figure 2F:
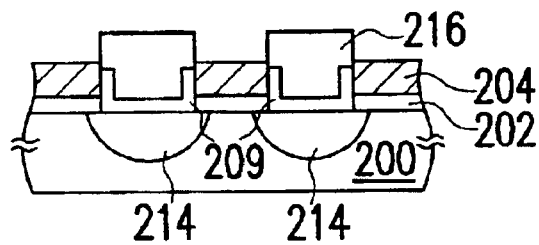

Refer to FIG. 2F, the insulating layer 216 is planarized with, for example, an etching-back process or a CMP process until the nitride layer 206 is exposed to leave the insulating layer 216 on the buried drain 214. The nitride layer 206 is then removed.

Figure 2G:
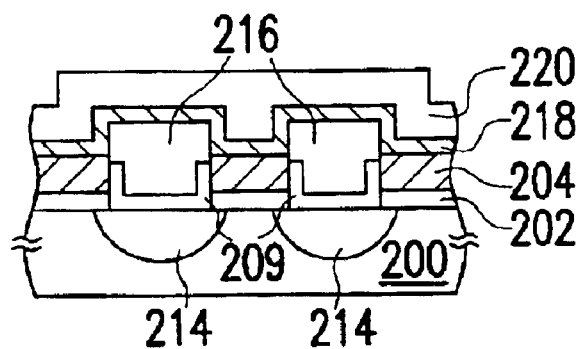

Refer to FIG. 2G, a silicon layer 218 and a cap layer 220 are sequentially formed over the substrate 200 covering the insulating layer 216 and the gate conductive layer 204. The silicon layer 218 comprises, for example, polysilicon and the cap layer 220 comprises, for example, silicon nitride.

Figure 2H:
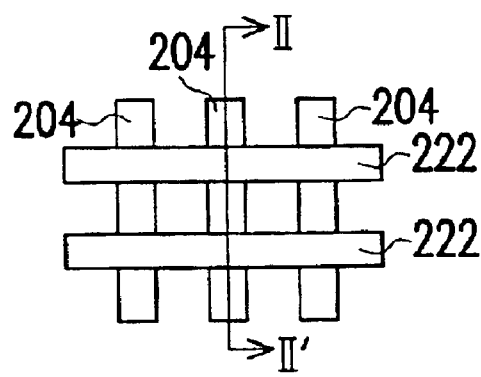
Figure 2I:
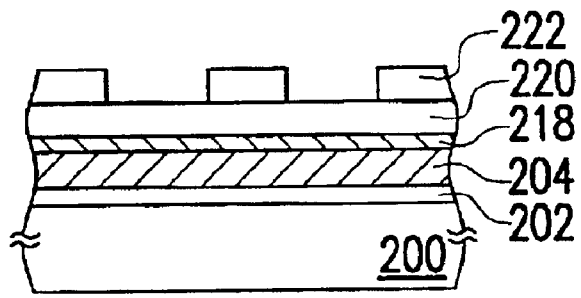

Refer to FIG. 2H and FIG. 2I, wherein FIG. 2H schematically depicts a top view of a resulting structure formed after the subsequent manufacturing steps and FIG. 2I depicts a cross-sectional view of the resulting structure along the line II–II' in FIG. 2H. As that shown in FIG. 2H and FIG. 2I, a patterned photoresist layer 222, which has a plurality of strip patterns perpendicular to the buried drain 214, is formed on the cap layer 220.

Figure 2J:
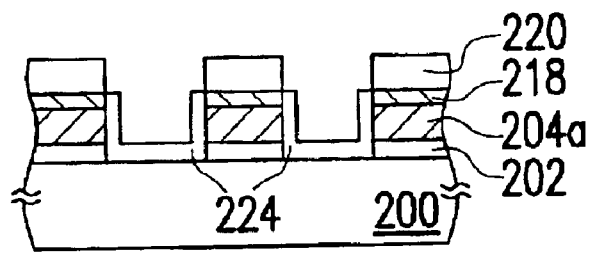

Refer to FIG. 2J, which depicts a cross-sectional view of the resulting structure formed after the subsequent manufacturing steps along the same line II–II' in FIG. 2H. The cap layer 220, the silicon layer 218, and the gate conductive layer 204 are patterned successively to form a plurality of gate structures 204a with the photoresist layer 222 as a mask. The photoresist layer 222 is removed. A liner layer 224 is then formed on the exposed surfaces of the silicon layer 218, the gate structure 204a and the substrate 200. The liner layer 224 comprises, for example, a silicon oxide layer formed by thermal oxidation.

Figure 2K:
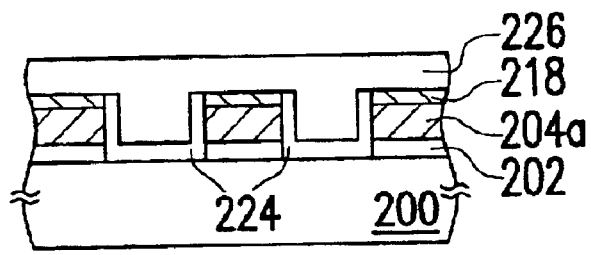

Refer to FIG. 2K, the cap layer 220 is removed and then a metal layer 226 is formed over the substrate 200 covering the liner layer 224 and the silicon layer 218. The metal layer 226 comprises, for example, titanium (Ti) or cobalt (Co).

Figure 2L:
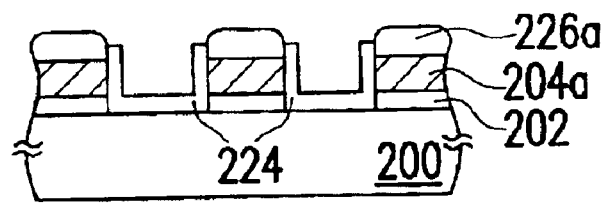

Refer to FIG. 2L, an annealing process is conducted to cause the metal layer 226 to react with the silicon layer 218 to form a metal salicide layer 226a. The unreacted metal layer 226 is then removed, leaving the metal salicide layer 226a to serve as a word-line electrically connecting with a plurality of gate structures 204a. The metal layer 226 may comprise titanium or cobalt. When a titanium layer is adopted, the annealing process requires a temperature from about 600° C. to about 800° C. When a cobalt layer is adopted, on the other hand, the annealing process requires a temperature from about 600° C. to about 700° C.

Since the liner layer 224 is formed on the exposed surfaces of the gate structures 204a and the substrate 200, the metal salicide layer 226a is not formed on the gate structures 204a nor on the substrate 200. Instead, the metal salicide layer 226a is formed on the silicon layer 218 located on the gate structures 204a.

Since the temperature required in the titanium/cobalt salicide process in the preferred embodiment of this invention is lower than the temperature required in the tungsten silicide process in the prior art, the thermal budget is decreased and the scaling down of the memory device is therefore easier. Moreover, since the resistance of the titanium/cobalt salicide word-lines in this invention is lower than that of the tungsten silicide word-lines in the prior art, the performance of the memory device can be enhanced.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a non-volatile memory, comprising:

providing a substrate having a strip stacked structure thereon, wherein the strip stacked structure comprises a gate conductive layer and a dielectric layer under the gate conductive layer;

forming a buried drain line as a buried bit line in the substrate beside the strip stacked structure;

forming an insulating layer on the buried drain line;

forming sequentially a silicon layer and a cap layer over the substrate covering the strip stacked structure and the insulating layer;

patterning the cap layer, the silicon layer, and the strip stacked structure in a direction perpendicular to the buried drain line to form a stacked gate structure, wherein the patterned silicon layer serves as a word line;

forming a liner layer on exposed surfaces of the silicon layer, the gate structures and the substrate;

removing the cap layer; and forming a metal salicide (self-aligned silicide) layer on the silicon layer.

2. A method for fabricating a nitride read-only memory (NROM), comprising:

providing a substrate having a strip stacked structure thereon, wherein the strip stacked structure comprises a gate conductive layer and a charge trapping layer under the gate conductive layer;

forming a buried drain line as a buried bit line in the substrate beside the strip stacked structure;

forming an insulating layer on the buried drain line;

forming sequentially a silicon layer and a cap layer over the substrate covering the strip stacked structure and the insulating layer;

patterning the cap layer, the silicon layer, and the strip stacked structure in a direction perpendicular to the buried drain line to form a stacked gate structure, wherein the patterned silicon layer serves as a word line;

forming a liner layer on exposed surfaces of the silicon layer, the gate structures and the substrate;

removing the cap layer; and forming a metal salicide (self-aligned silicide) layer on the silicon layer.

3. The method of claim 2, wherein forming the metal salicide layer comprises forming a titanium salicide layer.

4. The method of claim 3, wherein forming the titanium salicide layer requires a temperature from about 600° C. to about 800° C.

5. The method of claim 2, wherein forming the metal salicide layer comprises forming a cobalt salicide layer.

6. The method of claim 5, wherein forming the cobalt salicide layer requires a temperature from about 600° C. to about 700° C.

7. The method of claim 2, wherein the charge trapping layer comprises one selected from the group consisting of a silicon oxide/silicon nitride/silicon oxide (ONO) stacked layer, a silicon nitride/silicon nitride/silicon nitride (NNN) stacked layer and a silicon nitride/silicon nitride/silicon oxide (NNO) stacked layer.

8. The method of claim 2, wherein the liner layer comprises silicon oxide.

9. The method of claim 2, wherein the silicon layer comprises polysilicon.

10. The method of claim 2, wherein the insulating layer comprises silicon oxide formed from tetraethyl-orthosilicate (TEOS-oxide).

11. The method of claim 2, wherein the cap layer comprises silicon nitride.

12. A method for fabricating a read-only memory, comprising:

providing a substrate having a strip stacked structure thereon, wherein the strip stacked structure comprises a gate conductive layer and a gate dielectric layer under the gate conductive layer;

forming a buried drain line as a buried bit line in the substrate beside the strip stacked structure;

forming an insulating layer on the buried drain line;

forming sequentially a silicon layer and a cap layer over the substrate covering the strip stacked structure and the insulating layer;

patterning the cap layer, the silicon layer, and the strip stacked structure in a direction perpendicular to the buried drain line to form a stacked gate structure, wherein the patterned silicon layer serves as a word line;

forming a liner layer on exposed surfaces of the silicon layer, the gate structures and the substrate;

removing the cap layer; and forming a metal salicide (self-aligned silicide) layer on the silicon layer.

13. The method of claim 12, wherein forming the metal salicide layer comprises forming a titanium salicide layer.

14. The method of claim 13, wherein forming the titanium salicide layer requires a temperature from about 600° C. to about 800° C.

15. The method of claim 12, wherein forming the metal salicide layer comprises forming a cobalt salicide layer.

16. The method of claim 15, wherein forming the cobalt salicide layer requires a temperature from about 600° C. to about 700° C.

17. The method of claim 12, wherein the liner layer comprises silicon oxide.

18. The method of claim 12, wherein the silicon layer comprises polysilicon.

19. The method of claim 12, wherein the insulating layer comprises silicon oxide formed from tetraethyl-orthosilicate (TEOS-oxide).

20. The method of claim 12, wherein the cap layer comprises silicon nitride.

* * * * *